US009165654B1

(12) United States Patent
Oh et al.

(10) Patent No.: US 9,165,654 B1
(45) Date of Patent: Oct. 20, 2015

(54) NONVOLATILE MEMORY DEVICE HAVING PAGE BUFFER UNITS UNDER A CELL

(71) Applicant: SK HYNIX INC., Icheon (KR)

(72) Inventors: Sung Lae Oh, Cheongju (KR); Dong Hyuk Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/473,313

(22) Filed: Aug. 29, 2014

(30) Foreign Application Priority Data

Apr. 7, 2014  (KR) .................. 10-2014-0041017

(51) Int. Cl.
 *G11C 16/04* (2006.01)
 *G11C 16/06* (2006.01)

(52) U.S. Cl.
 CPC ....................................... *G11C 16/06* (2013.01)

(58) Field of Classification Search
 CPC . G11C 16/10; G11C 16/3454; G11C 2216/14
 USPC ........................... 365/185.12, 189.05, 185.05
 See application file for complete search history.

(56) References Cited

U.S. PATENT DOCUMENTS

| 8,627,188 B2* | 1/2014 | Weingarten et al. .......... 714/794 |
| 2008/0043532 A1* | 2/2008 | Hara ........................ 365/185.12 |
| 2013/0094294 A1 | 4/2013 | Kwak et al. |
| 2013/0194867 A1 | 8/2013 | Fukuda et al. |

FOREIGN PATENT DOCUMENTS

KR      10-2013-0040023 A      4/2013

* cited by examiner

*Primary Examiner* — Tuan T Nguyen

(57) ABSTRACT

A nonvolatile memory device includes a cell array, a distributed page buffer including a plurality of page buffer units disposed below the cell array, the plurality of page buffer units having a certain size; and a distributed page buffer control circuit including a plurality of page buffer control circuit units, each page buffer control circuit unit being arranged at one side of a corresponding page buffer unit, and configured to control operations of the corresponding page buffer unit, the plurality of page buffer control circuit units each having a predetermined size.

19 Claims, 4 Drawing Sheets

NONVOLATILE MEMORY DEVICE HAVING PAGE BUFFER UNITS UNDER A CELL

CROSS-REFERENCES TO RELATED APPLICATION

The present application claims priority to Korean Patent Application No. 10-2014-0041017, filed on Apr. 7, 2014, the disclosure of which is incorporated by reference herein in its entirety.

BACKGROUND

1. Technical Field

Embodiments of the present disclosure relate to a nonvolatile memory device, and more particularly, to a nonvolatile memory device in which a page buffer circuit and a page buffer control circuit, which are disposed below a cell region in a distributed fashion.

2. Related Art

Nonvolatile memory devices are memory devices which retain stored data even when a power source is off. Therefore, various nonvolatile memory devices, for example, flash memories, have been widely used.

Recently, to increase the degree of integration of nonvolatile memory devices, which typically have a two-dimensional (2D) structure in which memory cells are formed in a single layer on a semiconductor substrate, nonvolatile memory devices having a 3D structure in which memory cells are formed along a channel layer vertically protruding from a semiconductor substrate have been introduced.

However, as the degree of integration of nonvolatile memory devices continuously increases, the capacity of the nonvolatile memory devices increases, and thus, an area of a cell region also increases. Therefore, it is difficult to secure a sufficient area for a peripheral circuit region.

SUMMARY

Various embodiments of the present disclosure are directed to a structure in which a page buffer circuit occupying an area in a nonvolatile memory device is disposed below a cell region.

According to an aspect of an embodiment, there is provided a nonvolatile memory device. The nonvolatile memory device may include a cell array; a distributed page buffer including a plurality of page buffer units disposed below the cell array, the plurality of page buffer units having a certain size; and a distributed page buffer control circuit including a plurality of page buffer control circuit units, each page buffer control circuit unit being arranged at one side of a corresponding page buffer unit, and configured to control operations of the corresponding page buffer unit, the plurality of page buffer control circuit units each having a predetermined size.

According to an aspect of an embodiment, there is provided a nonvolatile memory device. The nonvolatile memory device may include an upper layer including a cell array, the cell array including memory cells; and a lower layer disposed below the upper layer and including circuits for performing read and write operations of cell data of the memory cells, wherein the lower layer includes: a distributed page buffer including a plurality of page buffer units arranged in a zigzag pattern, the plurality of page buffer units each having a certain size; and a distributed page buffer control circuit including a plurality of page buffer control circuit units, each of the plurality of page buffer control circuit units being arranged at one side of a corresponding page buffer unit, the plurality of page buffer control circuit each having a certain size.

Embodiments may improve the degree of integration of memory devices by disposing a page buffer circuit below a cell region.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
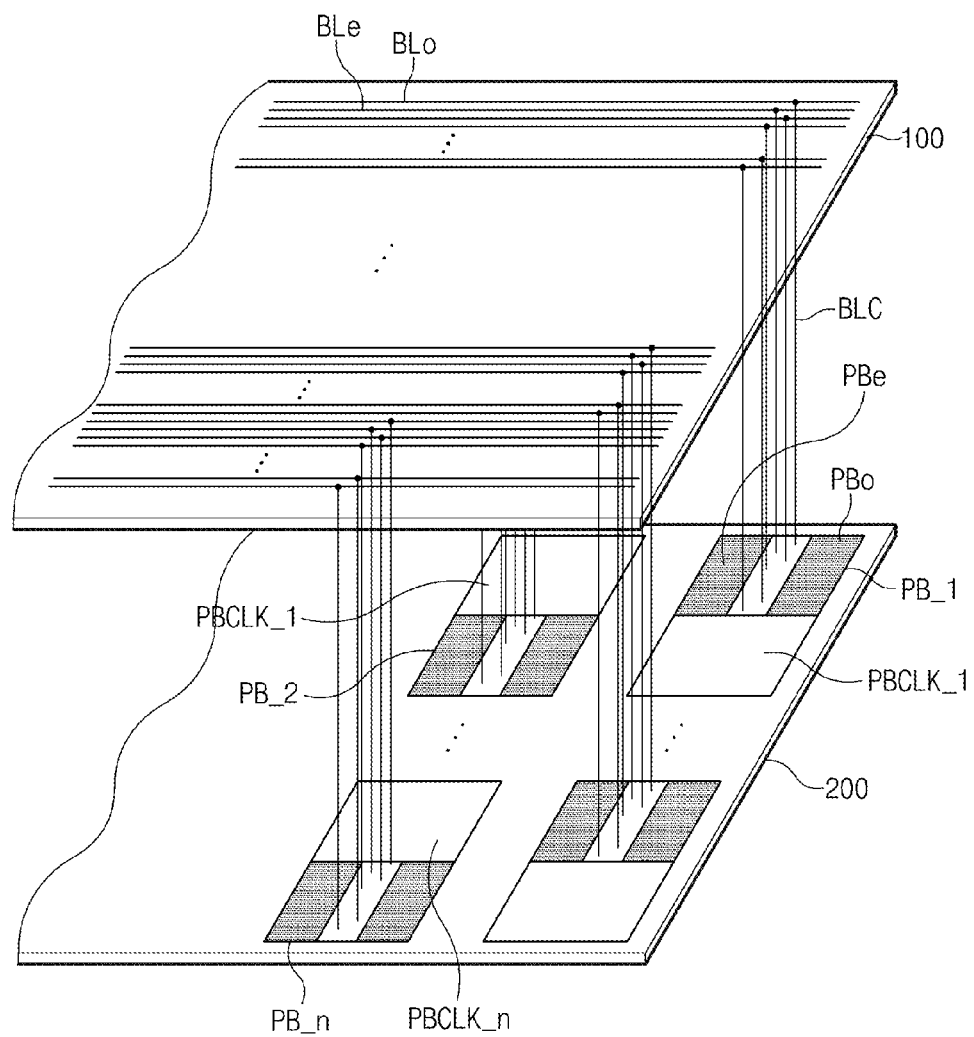
FIG. 1 is a perspective view illustrating a nonvolatile memory device according to an embodiment of the present disclosure.

Hereinafter, various embodiments of the present disclosure will be described with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment, and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate. Throughout the present disclosure, where possible, like reference numerals will be used to refer to like elements.

FIG. 1 is a perspective view illustrating a nonvolatile memory device according to an embodiment of the present disclosure. The nonvolatile memory device includes an upper layer 100 including a cell array, and a lower layer 200 including a page buffer and a page buffer control circuit. That is, the nonvolatile memory device has a Peripheral Under Cell (PUC) structure in which components (circuits) associated with read and write operations of cell data of memory cells of the cell array are located below the memory cells.

In particular, a page buffer that senses the cell data may be divided into a plurality of page buffer units, and arranged in a distributed fashion below the memory cells. In an embodiment, the page buffer is divided into n number of page buffer units PB_1 to PB_n, n being a positive integer, and each of the page buffer units PB_1 to PB_n have certain size, e.g., 1 KB. That is, the plurality of page buffer units PB_1 to PB_n forms a distributed page buffer.

Similarly, the page buffer control circuit that controls an operation of the page buffer may be divided into a plurality of page buffer control circuit units PBCLK_1 to PBCLK_n, and arranged in a distributed fashion below the memory cells. In an embodiment, each of the page buffer control circuit units PBCLK_1 to PBCLK_n has a predetermined size. The page buffer control circuit units PBCLK_1 to PBCLK n correspond to the page buffer units PB_1 to PB_n, respectively.

The page buffer units PB_1 to PB_n are spaced apart at certain intervals. The page buffer control circuit units PBCLK_1 to PBCLK_n have a one-to-one correspondence with the page buffer units PB_1 to PB_n. That is, one page buffer unit and one page buffer control circuit unit constitute a pair. In an embodiment, the page buffer control circuit units PBCLK_1 to PBCLK_n are each arranged on one side of a corresponding page buffer unit PB_1 to PB_n. In an embodiment, the page buffer units PB_1 to PB_n and corresponding page buffer control circuit units PBCLK_1 to PBCLK_n form a zigzag pattern. For example, referring to FIG. 1, the pairs of page buffer units and page buffer control circuit units are arranged in columns and rows. If a first page buffer control circuit unit of a first pair in a row is disposed at a first side of the page buffer unit, then in the next pair in the row, the page buffer control circuit unit is disposed at a second side of the page buffer unit, which is opposite to the first side with respect to the orientation of the pairs. Thus, the position of the page buffer control circuit units alternates in the columns and rows to form a zigzag pattern. Although the zigzag pattern has been described with reference to columns and rows for illustrative convenience, one of skill in the art will understand that embodiments are not limited thereto. In other embodiments, the zigzag pattern is formed when the position of the page buffer unit changes between adjacent pairs of page buffer units and page buffer control circuit units.

The page buffer units PB_1 to PB_n are coupled to bit lines BLe and BLo through bit line contacts BLC. In each of the page buffer units PB_1 to PB_n, an odd page buffer region PBo is coupled to an odd bit line BLo, and an even page buffer region PBe is coupled to an even bit line PBe. The odd page buffer region PBo is separate from the even page buffer region PBe. For example, the odd page buffer region PBo and the even page buffer region PBe are arranged in an upper portion and a lower portion (or a left portion and a right portion), respectively, of each of the page buffer units PB_1 to PB_n. A contact region in which interconnection lines of the odd page buffer region PBo and interconnection lines of the even page buffer region PBe are coupled to the bit line contacts BLC is disposed in a central portion of each of the page buffer units PB_1 to PB_n, that is, disposed between the odd page region PBo and the even page region PBe of each of the page buffer units PB_1 to PB_n.

Figure 2:
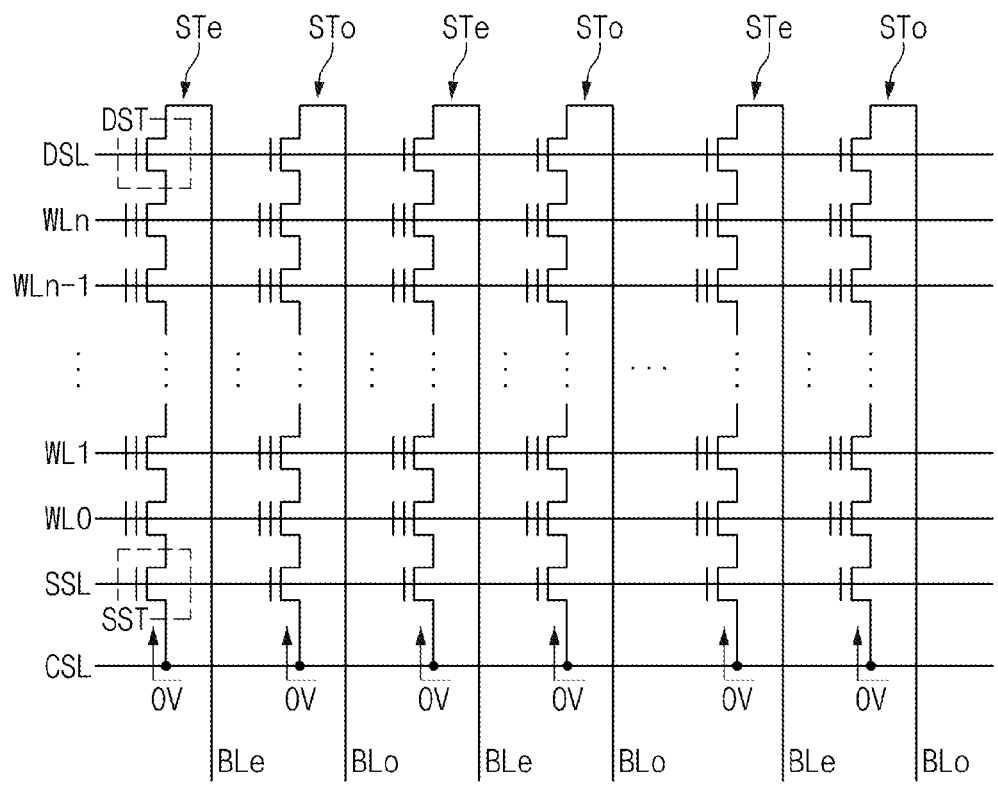
FIG. 2 is an circuit diagram illustrating an upper layer of a nonvolatile memory device according to an embodiment of the present disclosure.

FIG. 2 is a circuit diagram illustrating an upper layer of a nonvolatile memory device according to an embodiment of the present disclosure.

FIG. 1 illustrates an upper layer 100 that only includes the bit lines BLe and BLo, but a cell array disposed in an upper layer 100 may include a plurality of memory blocks, each of which is illustrated in FIG. 2. Each of the memory blocks may include a plurality of strings STo, each of which is coupled between an odd bit line BLo and a common source line CSL, and a plurality of strings STe, each of which is coupled between an even bit line BLo and the common source line CSL. That is, the strings STe and STo are coupled to corresponding bit lines BLe and BLo, respectively, and are commonly coupled to the common source line CSL.

Each of the strings STe and STo may include a source select transistor SST having a source terminal that is coupled to the common source line CSL, a plurality of memory cells, and a drain select transistor DST having a drain terminal that is coupled to a corresponding one of the bit lines BLe and BLo. The memory cells are coupled in series between the source select transistor SST and the drain select transistor DST. A gate of the source select transistor SST is coupled to a source select line SSL, gates of the memory cells are coupled to word lines WL0 to WLn, and a gate of the drain select transistor DST is coupled to a drain select line DSL.

The memory cells included in the memory block may be classified into physical page units or into logical page units. In an embodiment, memory cells coupled to one word line, e.g., WL0, constitute one physical page. In another embodiment, even memory cells coupled to one word line WL0 constitute one even physical page, and odd memory cells coupled to one word line WL0 constitute one odd physical page. Such a page (or the even page and the odd page) becomes a basic unit on which a programming operation or a read operation is performed. The memory cell array of FIG. 2 may be implemented in a 2D structure in which memory cells are horizontally arranged on the same plane (or layer) or in a 3D structure in which memory cells are vertically stacked.

In an embodiment, when the memory cell array has a 3D structure, the memory cell array may be formed in a straight channel structure. In another embodiment, when the memory cell array has a 3D structure, the memory cell array may be formed in a U-shaped channel structure. In the straight channel structure, a bit line and a source line are disposed over and below stacked memory cells, respectively. In the U-shaped channel structure, both of a bit line and a source line are disposed over stacked memory cells. However, embodiments are not limited thereto. That is, the memory cell array may have any structure.

Figure 3:
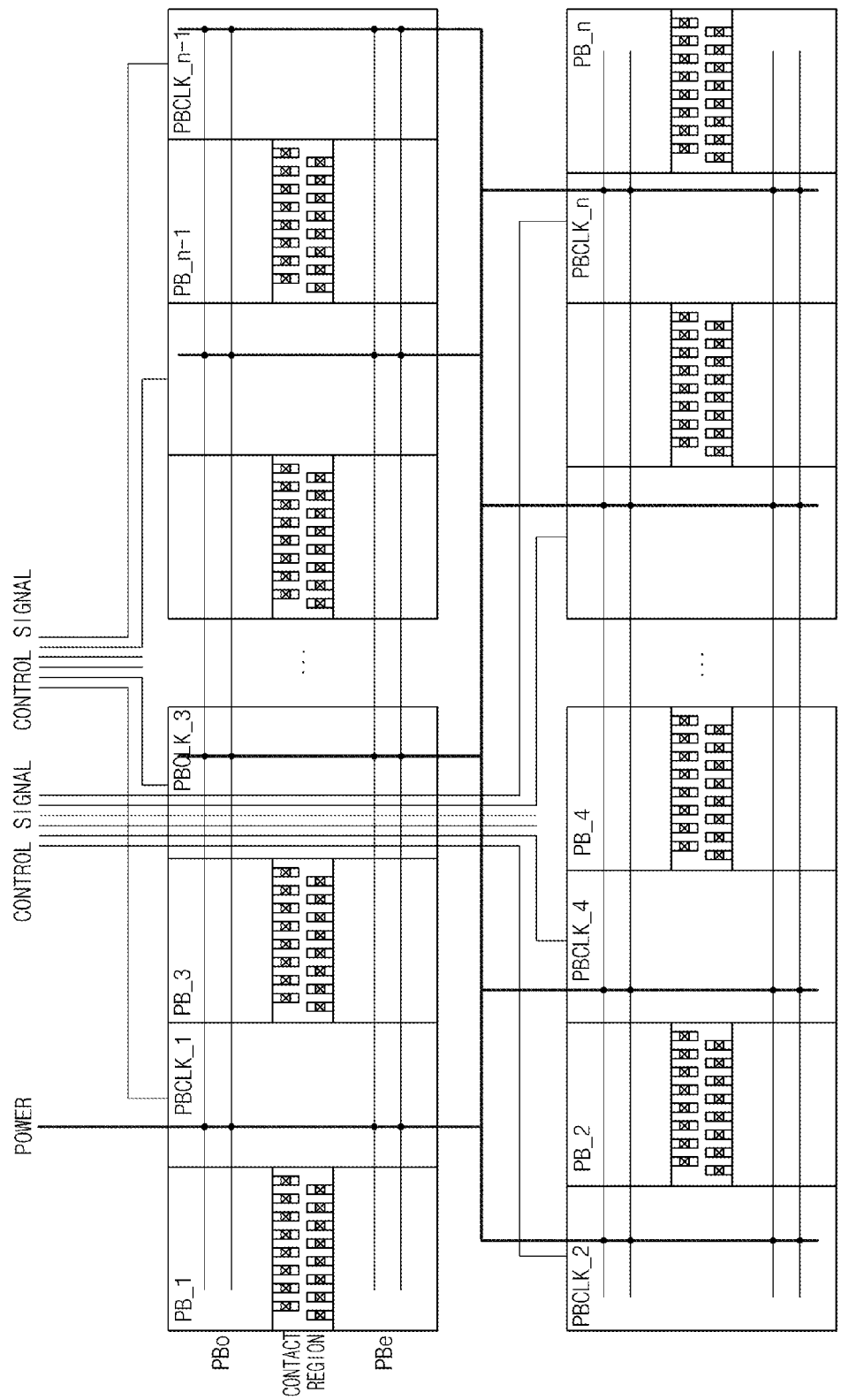
FIG. 3 is a view illustrating page buffer units and page buffer control circuit units disposed in a lower layer of a nonvolatile memory device according to an embodiment of the present disclosure.
Figure 4:
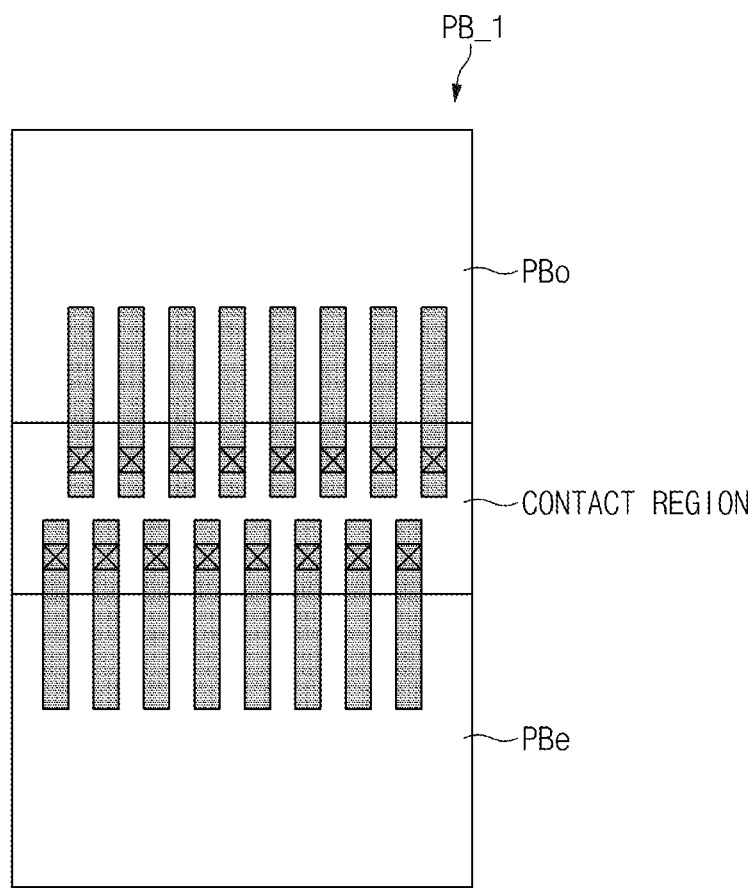
FIG. 4 is a view illustrating a contact region in a page buffer unit a according to an embodiment of the present disclosure.

FIG. 3 is a view illustrating page buffer units and page buffer control circuit units disposed in a lower layer of a nonvolatile memory device according to an embodiment of the present disclosure, and FIG. 4 is a view illustrating a contact region in a page buffer unit according to an embodiment of the present disclosure.

Each of the page buffer units PB_1 to PN_n may include an odd page buffer region PBo coupled to an odd bit line BLo, an even page buffer region PBe coupled to an even bit line BLe, and a contact region in which interconnection lines of the odd page buffer region PBo and interconnection lines of the even page buffer region PBe are coupled to bit line contacts BLC.

The odd page region PBo and the even page region PBe are symmetrical with respect to the contact region. That is, the contact region is disposed between the odd page region PBo and the even page region PBe. In other words, the odd page region PBo and the even page region PBe are disposed on both sides of the contact region. With respect to the orientation of the figure, the odd page region PBo and the even page region PBe are disposed above and below the contact region, respectively.

In an embodiment, not all of the page buffer units PB_1 to PB_n are arranged in the same row or column. In an embodiment, odd page buffer units PB_1, PB_3, . . . , and PB_n−1 are separate from even page buffer units PB_2, PB_4, . . . , and PB_n. That is, the odd page buffer units PB_1, PB_3, . . . , and PB_n−1 are arranged in a different row or column from that in which the even page buffer units PB_2, PB_4, . . . , and PB_n are arranged. For example, with respect to the orientation of the figure, the odd page buffer units PB_1, PB_3, . . . , and PB_n−1 are arranged in an upper row, and each of the page buffer control circuit units PBCLK_1, PBCLK_3, . . . , and PBCLK_n−1 is disposed at one side of a corresponding one of the odd page buffer units PB_1, PB_3, . . . , and PB_n−1 to form a pair. The even page buffer units PB_2, PB_4, . . . , and PB_n are arranged in a lower row, and each of the page buffer control circuit units PBCLK_2 to PBCLK_4, . . . , and PBCLK_n are disposed at one side of a corresponding one of the even page buffer units PB_2, PB_4, . . . , and PB_n to form a pair. The arrangement of the odd page buffer units PB_1, PB_3, . . . , and PB_n−1 and the arrangement of the even page buffer units PB_2, PB_4, . . . , and PB_n are spaced apart at certain intervals. In particular, each of adjacent odd and even page buffer units PB_1 and PB_2, PB_3 and PB_4, . . . , and PB_n−1 and PB_n in respective rows are arranged in a zigzag pattern. Interconnection lines that transmit control signals may be disposed in a region between the arrangement of the odd page buffer units PB_1, PB_3, . . . , and PB_n−1 and the arrangement of the even page buffer units PB_2, PB_4, . . . , and PB_n.

As illustrated in FIG. 4, interconnection lines of an odd page buffer region PBo coupled to bit line contacts BLC and interconnection lines of an even page region PBe coupled to bit line contacts BLC are arranged in an alternating pattern in a contact region of each of the page buffer units PB_1 to PB_n. That is, in an embodiment, the positions of interconnection lines of the odd page buffer region alternate with the positions of interconnection lines of the even page buffer region, such that the interconnection lines in the odd page buffer region are not directly aligned with interconnection lines of the even page buffer region in the contact region.

The page buffer control circuit units PBCLK_1 to PBCLK_n control operations of the corresponding page buffer units PB_1 to PB_n. Each page buffer control circuit unit PBCLK_1 to PBCLK_n is located on one side of a corresponding one of the page buffer units PB_1 to PB_n, such that there is one-to-one correspondence with the page buffer units PB_1 to PB_n. That is, each of the page buffer units PB_1 to PB_n and a corresponding one of the page buffer control circuit units PBCLK_1 to PBCLK_n are arranged to be adjacent to each other and constitute a pair. In an embodiment, each of the page buffer control circuit units PBCLK_1 to PBCLK_n thus adjacent to all of an odd page region PBo, a contact region, and an even page region PBe of each of the page buffer units PB_1 to PB_n.

A power line applying power is disposed in a region of each of the page buffer control circuit units PBCLK_1 to PBCLK_n, and power lines disposed in regions of the page buffer control circuit units PBCLK_1 to PBLCK_n are arranged parallel to each other.

Functions of the page buffer units PB_1 to PB_n and the page buffer control circuit units PBCLK_1 to PBCLK_n are substantially the same as those of existing page buffers and page buffer control circuits, and thus a detailed description thereof is omitted.

The above embodiments of the present disclosure are illustrative and not limitative. Various alternatives and equivalents thereof are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A nonvolatile memory device comprising:
a cell array;
a distributed page buffer including a plurality of page buffer units disposed below the cell array, the plurality of page buffer units having a certain size; and
a distributed page buffer control circuit including a plurality of page buffer control circuit units, each page buffer control circuit unit being arranged at one side of a corresponding page buffer unit, and configured to control operations of the corresponding page buffer unit, the plurality of page buffer control circuit units each having a predetermined size.

2. The nonvolatile memory device of claim 1, wherein the page buffer units are arranged in a zigzag pattern.

3. The nonvolatile memory device of claim 2, wherein, among page buffer units, odd page buffer units and even page buffer units are arranged in a zigzag pattern.

4. The nonvolatile memory device of claim 3, wherein the odd page buffer units are arranged in a row different from a row in which the even page buffer units are arranged.

5. The nonvolatile memory device of claim 1, wherein each of the page buffer units includes:
an even page buffer region coupled to even bit lines of the cell array;
an odd page buffer region coupled to odd bit lines of the cell array; and
a contact region in which interconnection lines of the even page buffer region and interconnection lines of the odd page buffer region are coupled to bit line contacts.

6. The nonvolatile memory device of claim 5, wherein the contact region is located between the even page buffer region and the odd page buffer region.

7. The nonvolatile memory device of claim 6, wherein the interconnection lines of the even page buffer region and the interconnection lines of the odd page buffer region are arranged in an alternating pattern in the contact region.

8. The nonvolatile memory device of claim 5, wherein each of the page buffer control circuit units is adjacent to the even page buffer region, the odd page buffer region, and the contact region of the corresponding page buffer unit.

9. The nonvolatile memory device of claim 1, further comprising power lines located in regions of the page buffer control circuit units,
wherein the power lines are arranged parallel to each other.

10. The nonvolatile memory device of claim 1, wherein the cell array has a two-dimensional (2D) structure in which memory cells in the cell array are horizontally arranged on the same plane.

11. The nonvolatile memory device of claim 1, wherein the cell array has a 3D structure in which memory cells are vertically stacked.

12. The nonvolatile memory device of claim 11, wherein the cell array has a straight channel structure in which a bit line and a source line are arranged over and below vertically stacked memory cells, respectively.

13. The nonvolatile memory device of claim 11, wherein the cell array has a U-shaped channel structure in which both of a bit line and a source line are arranged over vertically stacked memory cells.

14. A nonvolatile memory device comprising:
an upper layer including a cell array, the cell array including memory cells; and a lower layer disposed below the upper layer and including circuits for performing read and write operations of cell data of the memory cells, wherein the lower layer includes:

a distributed page buffer including a plurality of page buffer units arranged in a zigzag pattern, the plurality of page buffer units each having a certain size; and a distributed page buffer control circuit including a plurality of page buffer control circuit units, each of the plurality of page buffer control circuit units being arranged at one side of a corresponding page buffer unit, the plurality of page buffer control circuit each having a certain size.

15. The nonvolatile memory device of claim 14, wherein, among the page buffer units, odd page buffer units and even page buffer units are arranged in a zigzag pattern.

16. The nonvolatile memory device of claim 15, wherein the odd page buffer units are arranged in a row different from a row in which the even page buffer units are arranged.

17. The nonvolatile memory device of claim 14, further comprising power lines located in regions of the page buffer control circuit units, wherein the power lines are arranged parallel to each other.

18. The nonvolatile memory device of claim 14, wherein each of the page buffer units includes:

an even page buffer region coupled to even bit lines of the cell array;

an odd page buffer region coupled to odd bit lines of the cell array; and a contact region in which interconnection lines of the even page buffer region and interconnection lines of the odd page buffer region are coupled to bit line contacts, wherein the contact region is disposed between the even page buffer region and the odd page buffer region.

19. The nonvolatile memory device of claim 18, wherein each of the page buffer control circuit units is adjacent to the even page buffer region, the odd page buffer region, and the contact region of the corresponding page buffer unit.

* * * * *